(12) United States Patent
Chung et al.

(10) Patent No.: US 7,205,665 B1
(45) Date of Patent: Apr. 17, 2007

(54) POROUS SILICON UNDERCUT ETCHING DETERRENT MASKS AND RELATED METHODS

(75) Inventors: Vinh Chung, Lake Forest Park, WA (US); Jonathan Chan Mallari, Bothell, WA (US)

(73) Assignee: Neah Power Systems, Inc., Bothell, WA (US)

( * ) Notice: Subject to any disclaimer, the term of this patent is extended or adjusted under 35 U.S.C. 154(b) by 39 days.

(21) Appl. No.: 11/242,237

(22) Filed: Oct. 3, 2005

(51) Int. Cl.
*H01L 23/48* (2006.01)
*H01L 23/52* (2006.01)
*H01L 29/40* (2006.01)

(52) U.S. Cl. ............... 257/758; 257/537; 257/751; 438/597; 438/586

(58) Field of Classification Search ............ 257/54, 257/751, 624, 486, 478, 471, 537, 17, 758, 257/E29.143, E21.046, E21.062; 438/690, 438/597, 643, 653, 586, 570
See application file for complete search history.

(56) References Cited

U.S. PATENT DOCUMENTS

| | | | | |
|---|---|---|---|---|
| 4,931,845 A | * | 6/1990 | Ema | 257/751 |
| 4,985,750 A | * | 1/1991 | Hoshino | 257/751 |
| 5,525,837 A | * | 6/1996 | Choudhury | 257/751 |
| 5,614,437 A | * | 3/1997 | Choudhury | 438/653 |
| 2003/0132496 A1 | * | 7/2003 | Terano et al. | 257/449 |

* cited by examiner

*Primary Examiner*—Zandra V. Smith
*Assistant Examiner*—Thanh Y. Tran
(74) *Attorney, Agent, or Firm*—Thomas E. Loop

(57) ABSTRACT

The disclosed invention relates to masked silicon structures and methods for making porous silicon in selected areas of a silicon substrate via anodic etching. The masked silicon structures comprise: (1) a frontside barrier layer; and (2) a backside opaque ohmic contact layer. The frontside barrier layer includes a plurality of discrete barrier openings bounded by a contiguous frontside portion of the barrier layer, thereby defining a first aperture having a first shape and a first center point. The backside opaque ohmic contact layer includes a second aperture bounded by a contiguous backside portion of the ohmic contact layer, thereby defining a second aperture having a second shape and a second center point. The first and second center points share a perpendicular axis. The first shape is substantially the same as the second shape but slightly larger, and is trans-concentrically positioned relative to the second shape about the shared axis.

14 Claims, 5 Drawing Sheets

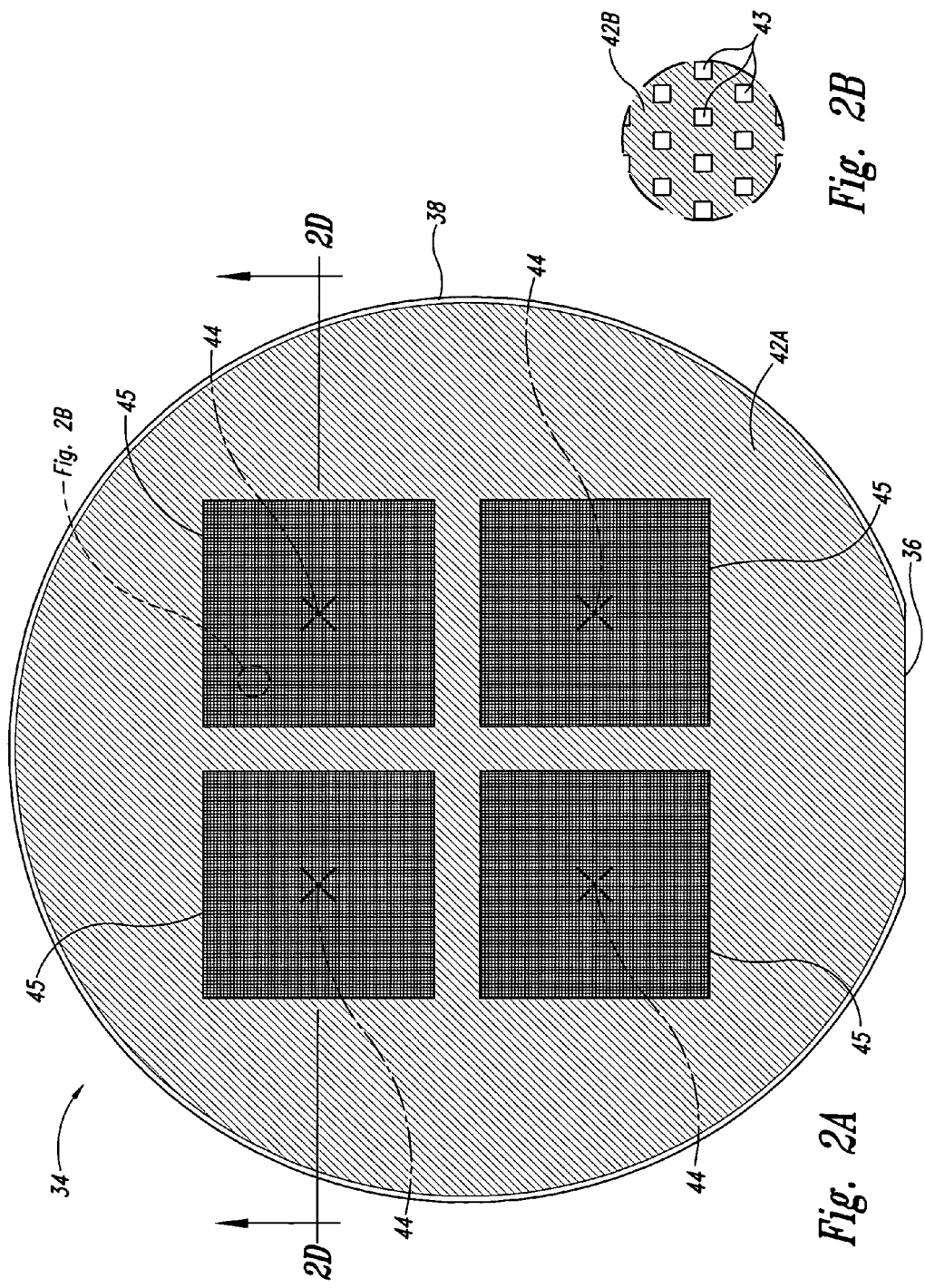

US 7,205,665 B1

POROUS SILICON UNDERCUT ETCHING DETERRENT MASKS AND RELATED METHODS

GOVERNMENT RIGHTS

This invention was made with United States Government support under Advanced Technology Program Award Number 70NANB3H3036 awarded by the National Institute of Standards and Technology (NIST). The United States Government has certain rights in the invention.

TECHNICAL FIELD

The present invention relates generally to porous silicon and, more specifically, to masks and related methods used to make macroporous silicon in defined unmasked areas of a silicon substrate without significant undercut etching underneath the masked areas.

BACKGROUND OF THE INVENTION

The photoelectrochemical oxidation and dissolution of silicon to form porous silicon is known. In this regard, it has been discovered that regular arrays of macropores with extremely large aspect ratios may be formed in n-type silicon substrates by photoelectrochemical anodic etching in hydrofluoric acid. (V. Lehman and H. Föll, *Formation Mechanism and Properties of Electrochemically Etched Trenches in N-Type Silicon*, J. Electrochem. Soc. 137, 653 (1990); U.S. Pat. No. 4,874,484 to Föll et al.). Lehman and Föll have explained the silicon pore formation phenomenon on the basis of a so-called "space charge region" model, which model assumes that a photogenerated current focuses electron holes ($h^+$) on pore tips because of the bending of the space charge region around the tips. In this regard, Lehman and Föll have hypothesized that a silicon wafer, when irradiated with photons of certain wavelengths, will promote valence electrons of the silicon atoms to an excited state and in so doing generate electron ($e^-$)—electron hole ($h^+$) pairs. An induced electric field created by an applied voltage potential between the silicon wafer (described as the working electrode) and a counter platinum electrode generates the photo current. The geometry of the pore tips focuses the strength of the electric field so as to attract the population of electron holes ($h^+$) to these locations thereby promoting dissolution of silicon into the hydrofluoric acid environment. The space charge region model seemingly has some merit for explaining the formation of macropores (i.e., average pore size>50 nm) in n-type silicon, especially the formation of regular pore arrays of acicular or columnar macropores. (M. Christopherson, J. Cartensen, and H. Föll, *Macropore-Formation on Highly Doped N-Type Silicon*, Phys. Stat. Sol. (a) 182(1), 45 (2000); V. Lehman, U, Grüning, Thin Solid Films, 297, 13–17 (1997)).

In general terms, macroporous silicon may be formed within defined areas of n-type silicon wafers by first applying a pattern to the frontside of each wafer (using standard photolithographic techniques) by means of a mask (e.g., photoresist overlaying a low temperature oxide (LTO) or silicon nitride layer) having an ordered array of square openings (e.g., 5 µm squares with an 8 µm pitch). The patterned wafer may then be alkaline etched to transform the ordered array of square openings in the mask into an ordered array of inverted pyramids, the tips of which act as electron hole ($h^+$) focusing points (generally needed for subsequent silicon dissolution). The wafer may then be etched with hydrofluoric acid under an anodic bias with backside illumination in a specially configured photoelectrochemical etch cell apparatus. As is known in the art, most traditional photoelectrochemical etch cells include a frontside chamber filled with a hydrofluoric acid solution used for the silicon etching, and a backside chamber filled with either a concentrated $H_3PO_4$ or KCl solution used for establishing an ohmic electrical contact with the wafer (V. Lehman, *Electrochemistry of Silicon*, Wiley-VCH Verlag GmbH, 17–20 (2002)). In some photoelectrochemical etch cells, the solution filled backside chamber is replaced by simply highly doping the entire backside of the wafer, or by applying a transparent film of GaIn eutectic to the backside of the wafer.

In accordance with the space charge region model, electron holes ($h^+$) generated by the backside illumination diffuse through the wafer and promote the dissolution of silicon mainly at the pore tips—thereby resulting in the formation of very high aspect ratio pores generally extending along the <100> direction (e.g., perpendicular to the front surface of the wafer). The physical characteristics associated with pore size, spacing, porosity, and specific surface area within the silicon wafer are generally determined by processing conditions such as, for example, selected mask pattern, hydrofluoric acid concentration, current density, bias potential, dopant type, dopant density, and crystal orientation.

A significant problem associated with existing macroporous silicon formation techniques, however, relates to the undercut etching that typically occurs underneath the frontside masked areas (refer generally to prior art FIG. 1B). In this regard, it has been reported that although macropore arrays with good quality may be obtained in the interior regions of the patterned masked area, "there will always be some macropore growth under the mask—in a rather irregular fashion." (H. Föll, M. Christopherson, J. Cartensen, and G. Hasse, *Formation and Application of Porous Silicon*, Mat. Sci. Eng. R. 39 (4), 93–141 (2002)) (see also, M. Christopherson, P. Merz, J. Quenzer, J. Carstensen, and H. Föll, *A New Method of Silicon Microstructuring with Electrochemical Etching*, Phys. Stat. Sol. (a), 182 (1), 561 (2000) (discussing trench-formation at the nitride mask edge); A. Jaballah et al., *Chemical Vapour Etching of Silicon and Porous Silicon: Silicon Solar Cells and Micromachining Applications*, Phys. Stat. Sol. (a) 202 (8), 1606–10 (2005) ("[o]ne can notice a small lateral growth of porous structures at the edge of the holes [pores], which confirm silicon dissolution under the photoresist mask.")). Indeed, existing techniques for making macroporous silicon have not successfully addressed the problem of undercut etching underneath the masked areas of the silicon substrate.

Accordingly, and in view the foregoing, there is still a need in the art for new and improved structures and related methods useful for making porous silicon in defined unmasked areas of a silicon substrate without significant undercut etching underneath the masked portions of the substrate. The present invention fulfills these needs and provides for further related advantages.

SUMMARY OF THE INVENTION

In brief, the present invention relates generally to porous silicon and, more specifically, to masked silicon structures useful for making macroporous silicon in defined unmasked areas of a silicon substrate without significant undercut etching underneath the masked areas, as well as to related methods. Accordingly, and in one embodiment, the invention is directed to a silicon structure useful for making porous silicon, including macroporous silicon, in selected areas of a silicon substrate (having a frontside and a backside) via anodic etching. In this embodiment, the silicon structure comprises: (1) a barrier layer adjacent to the frontside of the silicon substrate, wherein the barrier layer includes a plurality of discrete barrier openings positioned within and bounded by a contiguous frontside portion of the barrier layer, and wherein the contiguous frontside portion of the barrier layer defines a first aperture having a first shape and a first center point; and (2) an opaque ohmic contact layer adjacent to the backside of the silicon substrate, wherein the ohmic contact layer includes a second aperture bounded by a contiguous backside portion of the ohmic contact layer, and wherein the second aperture has a second shape and a second center point. In this embodiment, the first and second center points share an axis that is substantially perpendicular to the frontside and the backside of the silicon substrate. With respect to the first and second apertures that define the first and second shapes, the first shape is substantially the same as the second shape but larger, and is trans-concentrically positioned relative to the second shape about the shared axis.

In another embodiment, the present invention is directed to a method for making macroporous silicon in defined areas of a silicon substrate (having a frontside and a backside) without significant undercut etching underneath one or more masked areas. In this embodiment, the method comprises at least the following steps: (1) forming a barrier layer adjacent to the frontside of the silicon substrate, wherein the barrier layer is formed in a manner such that the barrier layer includes a plurality of discrete barrier openings positioned within and bounded by a contiguous frontside portion of the barrier layer, and such that the contiguous frontside portion defines a first aperture having a first shape and a first center point; (2) forming an opaque ohmic contact layer adjacent to the backside of the silicon substrate, wherein the ohmic contact layer is formed in a manner such that the ohmic contact layer includes a second aperture bounded by a contiguous backside portion of the ohmic contact layer, and such that the second aperture has a second shape and a second center point, and such that the first and second center points share an axis that is substantially perpendicular to the frontside and the backside of the silicon substrate, and such that the first shape is substantially the same as the second shape but larger, and such that the first shape is trans-concentrically positioned relative to the second shape about the axis that runs through the first and second center points, respectively; and (3) etching the silicon substrate in a photoelectrochemical etch cell to yield the porous silicon. The first and second steps in this embodiment and as set forth above may be done in reverse order.

These and other aspects of the present invention will become more evident upon reference to the following detailed description and attached drawings. It is to be understood, however, that various changes, alterations, and substitutions may be made to the specific embodiments disclosed herein without departing from their essential spirit and scope. In addition, it is to be further understood that the drawings are intended to be illustrative and symbolic representations of certain exemplary embodiments of the present invention and as such they are not necessarily drawn to scale. Finally, it is expressly provided that all of the various references cited herein are incorporated herein by reference in their entireties for all purposes.

BRIEF DESCRIPTION OF THE DRAWINGS

The drawings are intended to be illustrative and symbolic representations of the prior art and certain exemplary embodiments of the present invention, and as such they are not necessarily drawn to scale. In particular, the dimensions of the mask layers and various openings have been exaggerated for purposes of illustration—thus, it is to be expressly understood that the different layers, relative dimensions, sizes and distances depicted in the drawings are exemplary and may be varied in numerous ways. Finally, like reference numerals have generally been used to designate like features throughout the several views of the drawings.

FIG. 2A depicts a top frontside view of a silicon wafer having an adjacent masked layer thereon in accordance with an embodiment of the present invention. As shown, the masked layer includes four discrete frontside square openings or windows, each of which having a center point and including a plurality of smaller, discrete and regularly spaced apart square openings positioned within and bounded by each of the respective frontside square openings or windows, and wherein the plurality of smaller square openings allow for contact of the silicon wafer with an alkaline etchant (prior to placement in an operative arrangement within an etch cell).

FIG. 2B depicts an enlarged portion of the top frontside view of the silicon wafer of FIG. 2A, and shows an enlarged view of the plurality of smaller square openings that allow for contact of the silicon wafer with an alkaline etchant.

DETAILED DESCRIPTION OF THE INVENTION

As noted above, the present invention relates generally to porous silicon and, more specifically, to masked silicon structures useful for making macroporous silicon in defined unmasked areas of a silicon substrate without significant undercut etching underneath the masked areas, as well as to related methods. As is appreciated by those skilled in the art, regular arrays of acicular or columnar macropores with extremely large aspect ratios may be formed in n-type silicon substrates by photoelectrochemical anodic etching in hydrofluoric acid. Without necessarily prescribing to any particular scientific theory, silicon pore formation has been rationalized on the basis of a so-called "space charge region" model, which model assumes that a photogenerated current focuses electron holes ($h^+$) on pore tips because of the bending of the space charge region around the tips.

Figure 1A:
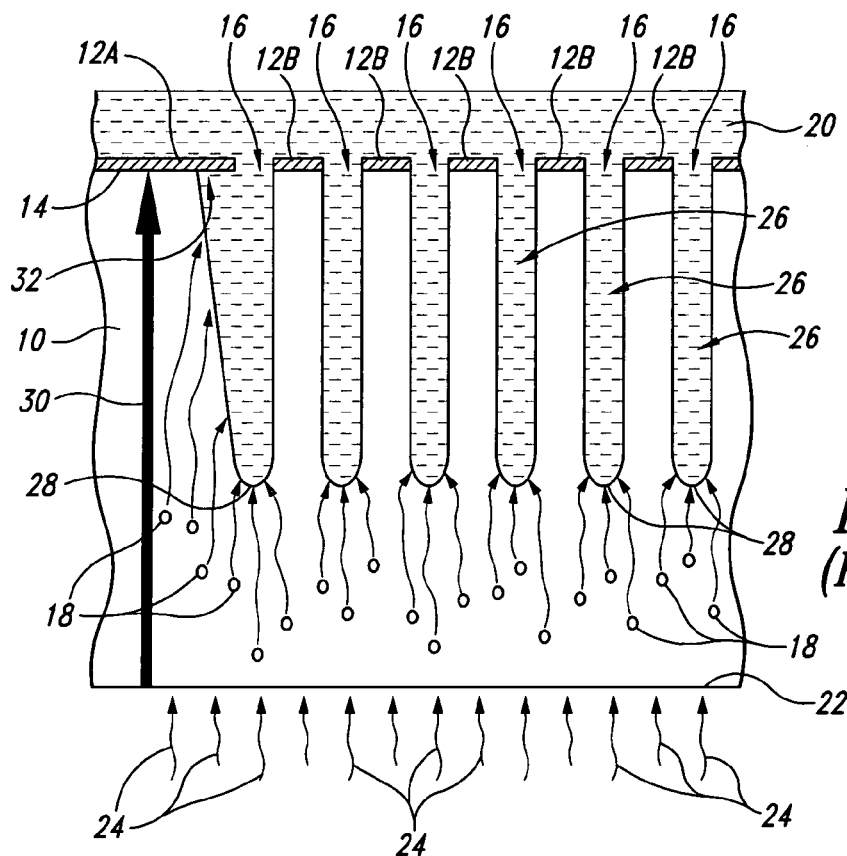
FIG. 1A depicts a side view of a portion of a silicon wafer etched in accordance with the prior art; accordingly, it shows an area underneath a masked portion and adjacent to an ordered array of macropores where undercut etching (namely, trench formation) has occurred.
Figure 1B:
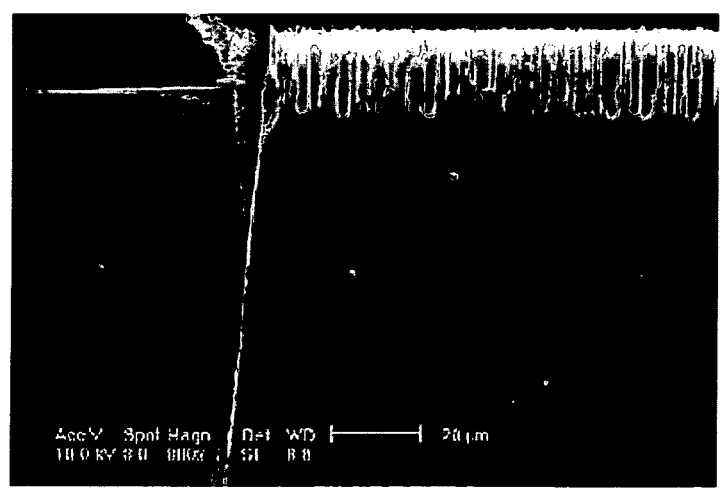
FIG. 1B is a photograph showing a side view of a portion of a silicon wafer etched in accordance with the prior art; accordingly, it shows an area underneath a masked portion and adjacent to an ordered array of macropores where undercut etching (namely, trench and irregular lateral pore formation) has occurred.

Accordingly, and with reference to prior art FIG. 1A, macroporous silicon traditionally has been formed within one or more defined areas of a n-type silicon wafer 10 by first applying a mask 12A, 12B (e.g., a barrier layer comprising photoresist overlaying a low temperature oxide (LTO) or silicon nitride layer) to the frontside 14 of the wafer 10. The mask 12A, 12B is generally structured so as to define an ordered array of square openings 16 (e.g., 5 μm squares with an 8 μm pitch). The patterned silicon wafer 10 is then alkaline etched to transform the ordered array of square openings 16 in the mask 12A, 12B into an ordered array of inverted pyramids (not shown), the tips of which act as electron hole ($h^+$) 18 focusing points (generally needed for subsequent and ordered silicon dissolution). The silicon wafer 10 is then etched with hydrofluoric acid 20 under an anodic bias with backside illumination in a specially configured photoelectrochemical etch cell apparatus (not shown). More specifically, the silicon wafer 10 is positioned within an etch cell and irradiated on its backside 22 with photons 24 of selected wavelengths, thereby promoting valence electrons of the silicon atoms to an excited state and simultaneously generating a plurality of electron ($e^-$)—electron hole ($h^+$) pairs. An induced electric field (not shown) created by an applied voltage potential between the silicon wafer 10 and a counter platinum electrode (not shown) generates the photo current, which, in turn, initiates the formation of pores 26 that extend perpendicularly into the silicon wafer 10. The geometry of the pore tips 28 focuses the strength of the electric field so as to attract the population of electron holes ($h^+$) 18 to these locations thereby promoting dissolution of silicon into the surrounding hydrofluoric acid 20 environment of the etch cell. The maximum diffusion length 30 associated with the population of electron holes ($h^+$) 18 is generally equal to about the thickness (e.g., about 300 to 500 microns) of the silicon wafer 10. A significant problem, however, associated with such traditional macroporous silicon formation techniques relates to the significant undercut etching 32 that typically occurs underneath the contiguous or non-patterned portion 12A of frontside mask 12A, 12B.

The present invention solves this significant technical problem by providing a new type of masking scheme that deters undercut etching (such as, for example, trenching and irregular lateral pore formation) during the photoelectrochemical etching of porous silicon, especially macroporous silicon. In this regard, and with reference to FIGS. 2A–2D, the present invention in one embodiment is directed to a specially masked silicon structure 34 useful for making macroporous silicon in one or more selected areas of a silicon substrate 36 (such as, for example, a standard 4 inch silicon wafer) via photoelectrochemical anodic etching. As shown, the silicon substrate 36 has a masked frontside 38 and a masked backside 40. More specifically, the silicon structure 34 comprises: (1) a barrier layer 42A, 42B positioned adjacent to the frontside 38 of the silicon substrate 36; and (2) an opaque ohmic contact layer 46A, 46B positioned adjacent to the backside 40 of the silicon substrate 36.

As best shown in FIGS. 2A and 2B, the frontside barrier layer 42A, 42B is patterned (via standard photolithography techniques) onto the frontside 38 of the silicon substrate 36 such that it defines a plurality of discrete and regularly spaced apart barrier openings 43 (e.g., ordered array of 5 μm squares with an 8 μm pitch) positioned within and bounded by a contiguous (i.e., non-patterned) frontside portion 42A of the barrier layer 42A, 42B. The barrier layer 42A, 42B in some embodiments consists essentially of (i) a photoresist layer overlying a low temperature oxide (LTO) layer (having a combined thickness ranging from about 3,000 Å to about 3,500 Å), or (ii) a silicon nitride layer (having a thickness ranging from about 800 Å to about 1,500 Å). As best shown in FIG. 2A, the contiguous frontside portion 42A of the barrier layer 42A, 42B defines four discrete and substantially identical first apertures 45, with each of the first apertures 45 defining a first shape, namely, a square, with each square having a first center point 44.

Figure 2C:
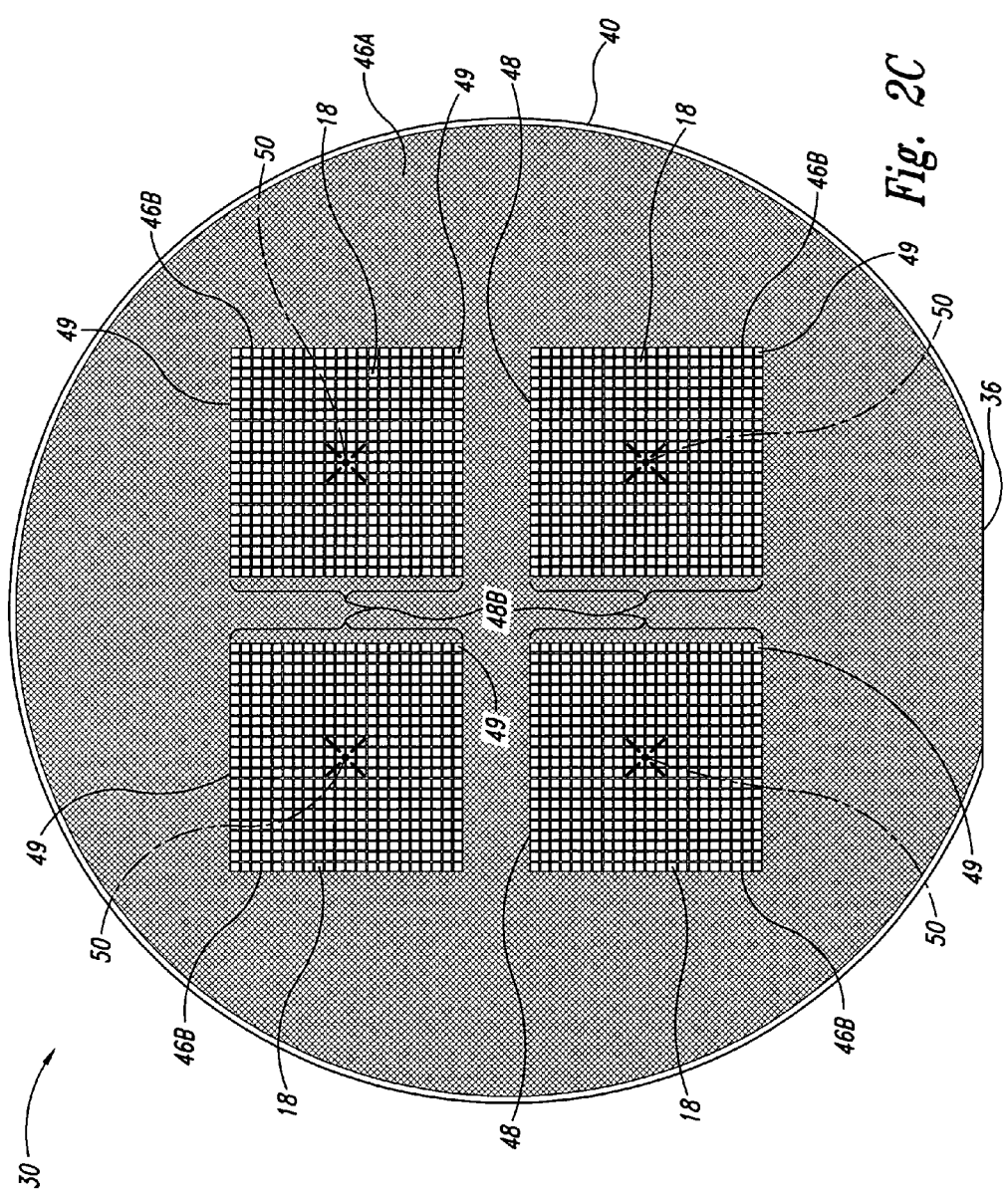
FIG. 2C depicts a bottom backside view of the silicon wafer shown in FIG. 2A, wherein the backside of the wafer has an adjacent opaque ohmic contact layer thereon, and wherein the opaque ohmic contact layer includes four discrete backside square openings or windows, each of which having a center point and including a plurality of smaller, discrete and regularly spaced apart square openings positioned within and bounded by each of the respective backside square openings or windows, and wherein the plurality of smaller square openings allow for contact of the silicon wafer with light (when placed in operative arrangement within an etch).

As best shown in FIG. 2C, the ohmic contact layer 46A, 46B is likewise patterned onto the backside 40 of the silicon substrate 36 and defines four discrete and substantially identical second apertures 48 bounded by a contiguous (i.e., non-patterned) backside portion 46A of the ohmic contact layer 46. As shown, the ohmic contact layer 46A, 46B further includes an integral grid portion 48B positioned across the second aperture 48. The integral grid portion 48B defines a plurality of discrete and regularly space apart square grid openings 49 (that allow for backside illumination of the silicon substrate 36), wherein each of the plurality of square grid openings 49 are about the same size as one another. The ohmic contact layer 46A, 46B in some embodiments consists essentially of aluminum (having a thickness ranging from about 2,000 Å to about 5,000 Å); however, other opaque and conductive materials may be used instead of aluminum, so long as (i) the material forms a good ohmic contact with the backside 40 of the silicon substrate 36, and (ii) the material is able to effectively block backside illumination from the etch cell. The four discrete second apertures 48 each define a second shape, namely, a square, with each square having a second center point 50.

Figure 2D:
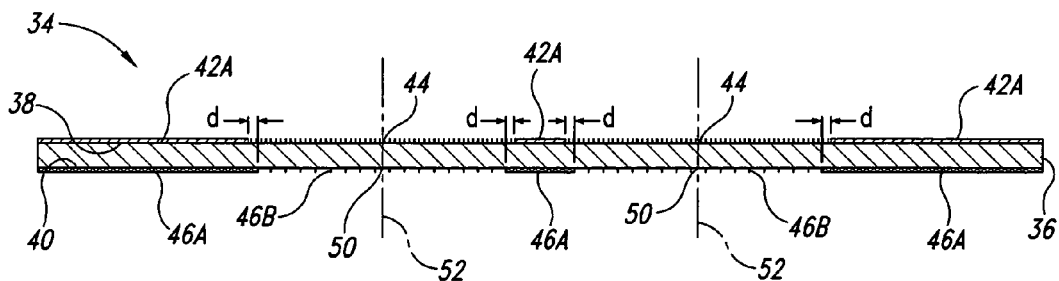
FIG. 2D depicts a side view of the silicon wafer shown in FIGS. 2A and 2C, and shows that the respective center points of the frontside and backside square openings or windows each share a perpendicular axis, and that the dimensions of the frontside square openings or windows are substantially the same shape as the backside square openings or windows but larger, and that the frontside square openings or windows are trans-concentrically positioned relative to the respective backside square openings or windows.

As best shown in FIG. 2D, the first and second center points 44, 50 associated with each of the first and second apertures 42, 48 share an axis 52 that is substantially perpendicular to the frontside 38 and the backside 40 of the silicon substrate 36. With respect to the first and second apertures 42, 48 that define the first and second shapes, the first shape is substantially the same as the second shape but slightly larger in overall dimension (by an amount represented by d) and is trans-concentrically positioned relative to the second shape about the shared axis 52. In connection with a standard silicon wafer having a thickness of about 500 μm and first and second square apertures 42, 48 as depicted in FIGS. 2A–2D (and having approximate dimensions of 23.5 mm×23.5 mm and 25 mm×25 mm, respectively), the second square is generally about 8 to 19 percent, and more specifically about 13 to 14 percent larger in total area than the first square. In this configuration, it is believed that the maximum diffusion length 30' (as illustrated best in FIG. 3B) associated with the population of electron holes ($h^+$) (generated by the backside illumination) is effectively increased, thereby resulting in the formation of truncated pores 26' as opposed to undercut etching such as, for example, trenching and irregular lateral pore formation.

Figure 3A:
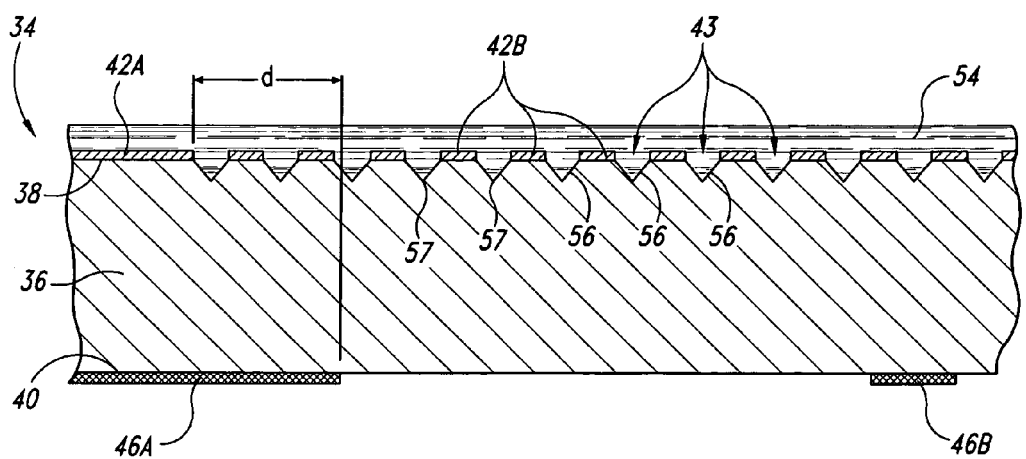
FIG. 3A depicts a side view of a portion of the silicon wafer shown in FIGS. 2A and 2C, wherein the plurality of smaller square openings have been etched with a KOH etchant so as to yield an ordered array of inverted pyramids that extend into the silicon wafer.
Figure 3B:
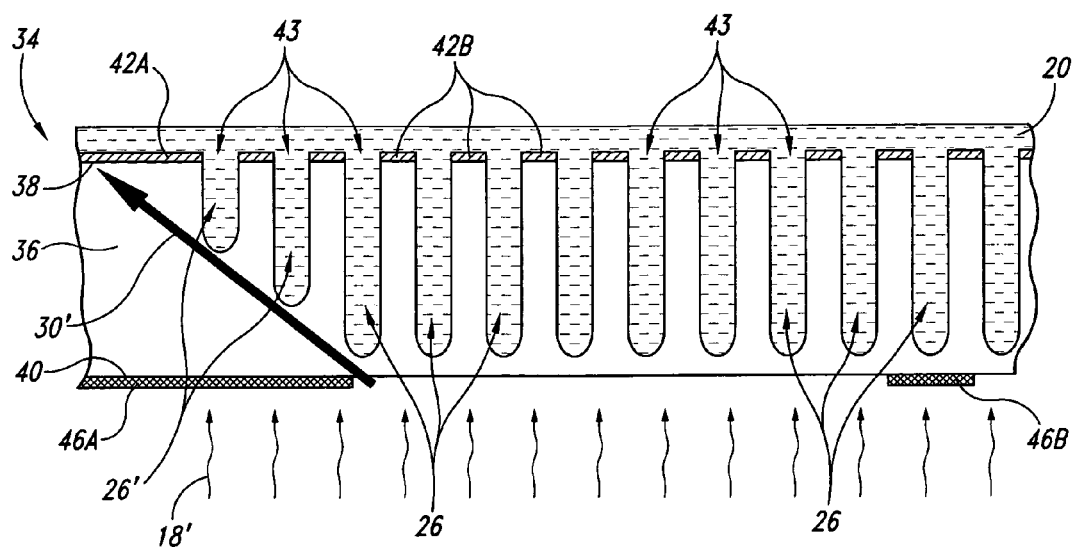
FIG. 3B depicts a side view of a portion of the silicon wafer shown in FIGS. 2A and 2C, wherein the plurality of smaller square openings has been (i) first contacted with a KOH etchant so as to yield an ordered array of inverted pyramids that extend into the silicon wafer, and (ii) subsequently contacted with a HF etchant while having backside illumination in an etch cell so as to yield macroporous silicon.
Figure 3C:
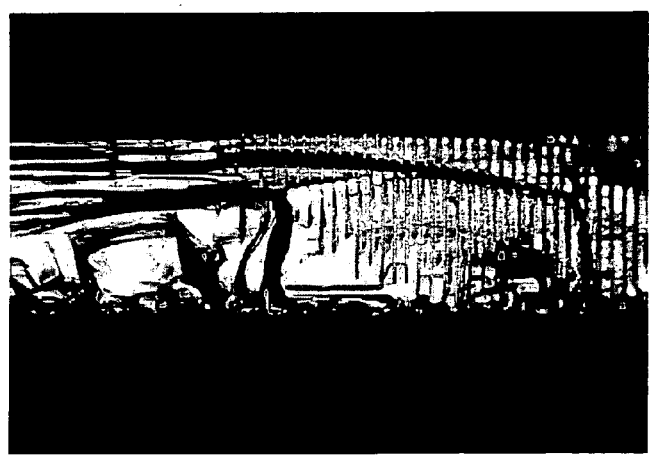
FIG. 3C is a photograph showing a side view of a portion of a silicon wafer etched in accordance with the present invention, wherein the photograph shows several truncated pores (as opposed to undercut etching).

In another embodiment, the present invention is directed to a method for making porous silicon, especially macroporous silicon, in defined areas of a silicon substrate (having a frontside and a backside) without significant undercut etching underneath one or more masked areas. In this embodiment and with reference to FIGS. 3A–3C (and in view of FIGS. 2A–2D), the method comprises at least the following steps: (1) forming a barrier layer 42A, 42B adjacent to the frontside 38 of the silicon substrate 36, wherein the barrier layer 42A, 42B is formed in a manner such that the barrier layer 42A, 42B includes a plurality of discrete barrier openings 43 (best shown in FIGS. 2A and 2B) positioned within and bounded by a contiguous frontside portion 42A of the barrier layer 42A, 42B, and such that the contiguous frontside portion 42A defines a first aperture 45 having a first shape and a first center point 44; (2) forming an opaque ohmic contact layer 46A, 46B adjacent to the backside 40 of the silicon substrate 36 (best shown in FIG. 2C), wherein the ohmic contact layer 46A, 46B is formed in a manner such that the ohmic contact layer 46A, 46B includes a second aperture 48 bounded by a contiguous backside portion 46A of the ohmic contact layer 46A, 46B, and such that the second aperture 48 has a second shape and a second center point 50, and such that the first and second center points 44, 50 share an axis 52 that is substantially perpendicular to the frontside 38 and the backside 40 of the silicon substrate 36 (best shown in FIG. 2D), and such that the first shape is substantially the same as the second shape but slightly larger, and such that the first shape is trans-concentrically positioned relative to the second shape about the axis 52 that runs through the first and second center points 44, 50, respectively; and (3) etching the silicon substrate 36 in first an alkaline etch solution 54 (as best shown in FIG. 3A) to transform the plurality of discrete barrier openings 43 in the barrier layer 42A, 42B into an ordered array of inverted pyramids 56, the tips 57 of which act as electron hole ($h^+$) focusing points, and then in a hydrofluoric acid solution 20' (as best shown in FIG. 3B) in a photoelectrochemical etch cell (not shown) to yield the porous or macroporous silicon (as best shown in FIG. 3C). The first and second steps in this embodiment and as set forth above may be done in reverse order.

In another aspect, it is specifically contemplated and believed that the above method can be used to make random or self-assembled porous silicon or macroporous silicon. In this regard, the method is essentially the same as above except that no frontside mask is needed or provided. If a frontside mask is provided, however, it lacks the plurality of discrete and regularly spaced apart square opening used to initiate inverted pyramid formation via alkaline etching. In this configuration, and because there are no ordered focusing points (generally needed for ordered silicon dissolution), pores will self-assembly and form randomly on and extending into the frontside of the silicon substrate without any significant edge defects.

For purposes of illustration and not limitation, the following example more specifically discloses various aspects of the present invention.

EXAMPLE 1

Process Steps for Making Porous Silicon without Significant Undercut Etching Underneath the Masked Areas of the Silicon Wafer Macroporous silicon was made in defined areas of a silicon wafer without significant undercut etching underneath the masked areas in accordance with the following process steps:

Step 1. Wafer Spec: Wafers were provided by Wacker-Siltronic with 3,000–3,500 Å of Low Temperature Oxide (LTO) on the frontside.

Step 2. Wafer Cleaning: A single wafer was cleaned with Nanostrip for 30 minutes, then in BOE for 15 minutes, and then with a spin rinse dryer (SRD).

Step 3. Al Contact Doping: The wafer was doped by using a spin on dopant on the backside and inserting into a furnace. The furnace was heated to a temperature of 950° C. under an atmosphere of nitrogen (6 standard liters per min or STLM) and Oxygen (0.2 STLM) with a temperature ramp up cycle of 10° C./min. The wafers were then heated at 925° C. for 30 minutes. The furnace was then cooled to 850° C. with a ramp down cycle of 5° C./min with the oxygen increased 2 STLM. The wafer was then removed and allowed to cool. The wafer was then cleaned in BOE for 10 minutes, and then cleaned with a SRD.

Step 4. Photolithography: The frontside was patterned with photoresist. Photoresist was spun onto the wafer with a spinner at 3,000 rpm. It was then baked for 30 minutes at 90° C. The photoresist was exposed to UV for 3 seconds through a chrome-on-glass mask (as shown generally in FIG. 2A). The unexposed photoresist was removed with a developer. Then the wafer was cleaned with a SRD.

Step 5. RIE: The patterned LTO was etched using an RIE (reactive ion etcher) exposing the bare silicon underneath.

Step 6. Barrel Etch: The wafer was cleaned in a Barrel Etch to remove residue from the RIE process.

Step 7. Photoresist Strip: The exposed photoresist was removed using EKC830 for 10 minutes and then AZ300T for 5 minutes. The wafer was then cleaned with a SRD.

Step 8. Metallization: A 5,000 Å aluminum film was deposited on the backside of the wafer using PVD.

Step 9. Photolithography: The backside was patterned with photoresist. Photoresist was spun onto the wafer with a spinner at 3,000 rpm. It was then baked for 30 minutes at 90° C. The photoresist was exposed to UV for 3 seconds through a mask (as shown generally in FIG. 2C). The unexposed photoresist was removed with a developer. Then the wafer was cleaned with a SRD.

Step 10. Al Etch: The unexposed aluminum was etched with Alameda Al etchant for 20 seconds at 100° C. to expose the doped bare silicon.

Step 11. Photoresist Strip: The exposed photoresist was removed using EKC830 for 10 minutes and then AZ300T for 5 minutes. Then the wafer was cleaned with a SRD.

Step 12. Metal Anneal: The aluminum was annealed by placing the wafer in furnace and heating to 400° C. with a ramp up of 10° C./min under 6 STLM of Argon. The wafer was heated at 400° C. for 30 minutes. Then the furnace was then cooled to room temperature with a ramp down of 5° C./min under 6 STLM of Nitrogen.

Step 13. KOH Etch: The wafer was placed in a fixture the exposed the frontside only. The front side was then etched in 28% KOH at 65° C. for about 15 minutes. The wafer was then cleaned with a SRD.

Step 14. Anodic Si Etching: The wafer was anodically etched in 4–6 wt % HF for 16–24 hours under a bias of 1.4 to 6V, and a current density fo 18–25 mA/cm$^2$ at 14–20° C. in an photoelectrochemical etch cell.

Step 15. Wafer Cleaning: The wafer was cleaned with a SRD.

Step 16. Grinding: The backside was ground to open the pores. The frontside was also ground to make the surface of the backside match in roughness. The thickness of the grounded wafer was about 400 μm.

Step 17. Wafer Cleaning: The wafer was cleaned in HF/HNO$_3$/Acetic Acid for 30 minutes. The wafer was then sonicated in isopropanol for 30 minutes. The wafer was then cleaned with a SRD.

Step 18. Barrel Etch: The wafer was cleaned in a Barrel Etch to remove residue from the earlier processes.

While the present invention has been described in the context of the embodiments illustrated and described herein, the invention may be embodied in other specific ways or in other specific forms without departing from its spirit or essential characteristics. Therefore, the described embodiments are to be considered in all respects as illustrative and not restrictive. The scope of the invention is, therefore, indicated by the appended claims rather than by the foregoing description, and all changes that come within the meaning and range of equivalency of the claims are to be embraced within their scope.

What is claimed is:

1. A silicon structure useful for making porous silicon in selected areas of a silicon substrate via anodic etching, the silicon substrate having a frontside and a backside, the silicon structure comprising:

a barrier layer adjacent to the frontside of the silicon substrate, the barrier layer including a plurality of discrete barrier openings positioned within and bounded by a contiguous frontside portion of the barrier layer, the contiguous frontside portion of the barrier layer defining a first aperture having a first shape and a first center point; and an opaque ohmic contact layer adjacent to the backside of the silicon substrate, the ohmic contact layer including a second aperture bounded by a contiguous backside portion of the ohmic contact layer, the second aperture having a second shape and a second center point;

wherein the first and second center points share an axis substantially perpendicular to the frontside and the backside of the silicon substrate, and wherein the first shape is substantially the same as the second shape but larger, and wherein the first shape is trans-concentrically positioned relative to the second shape about the axis.

2. The silicon structure of claim 1 wherein the silicon substrate is a silicon wafer.

3. The silicon structure of claim 1 wherein the plurality of discrete barrier openings positioned within and bounded by the contiguous frontside portion of the barrier layer are an ordered array of square openings.

4. The silicon structure of claim 1 wherein the plurality of discrete barrier openings positioned within and bounded by the contiguous frontside portion of the barrier layer are square base portions of an ordered array of inverted pyramids that extend into the silicon substrate.

5. The silicon structure of claim 1 wherein the barrier layer consists essentially of (i) a photoresist layer overlying a low temperature oxide (LTO) layer or (ii) a silicon nitride layer.

6. The silicon structure of claim 1 wherein the ohmic contact layer consists essentially of aluminum.

7. The silicon structure of claim 1 wherein the ohmic contact layer further includes an integral grid portion positioned across the second aperture.

8. The silicon structure of claim 7 wherein the grid portion defines a plurality of discrete grid openings, wherein each of the plurality of grid openings are about the same size as one another.

9. The silicon structure of claim 1 wherein each of the plurality of discrete barrier openings are about the size as one another.

10. The silicon structure of claim 1 wherein the first and second shapes are squares.

11. The silicon structure of claim 1 wherein area defined by the first shape is substantially the same as the area defined by second shape but larger by about 13% to about 14%.

12. A method for making porous silicon in defined areas of a silicon substrate without significant undercut etching underneath one or more masked areas, the silicon substrate having a frontside and a backside, the method comprising at least the following steps:

forming a barrier layer adjacent to the frontside of the silicon substrate, the barrier layer being formed in a manner such that the barrier layer includes a plurality of discrete barrier openings positioned within and bounded by a contiguous frontside portion of the barrier layer, and such that the contiguous frontside portion defines a first aperture having a first shape and a first center point;

forming an opaque ohmic contact layer adjacent to the backside of the silicon substrate, the ohmic contact layer being formed in a manner such that the ohmic contact layer includes a second aperture bounded by a contiguous backside portion of the ohmic contact layer, and such that the second aperture has a second shape and a second center point, and such that the first and second center points share an axis that is substantially perpendicular to the frontside and the backside of the silicon substrate, and such that the first shape is substantially the same as the second shape but larger, and such that the first shape is trans-concentrically positioned relative to the second shape about the axis that runs through the first and second center points, respectively; and etching the silicon substrate in a photoelectrochemical etch cell to yield the porous silicon.

13. The method of claim 12 wherein the silicon substrate is a silicon wafer.

14. The method of claim 12 wherein the porous silicon is macroporous silicon.

\* \* \* \* \*